United States Patent
Conte et al.

(10) Patent No.: US 7,576,591 B2
(45) Date of Patent: Aug. 18, 2009

(54) CHARGE PUMP SYSTEM AND CORRESPONDING METHOD FOR MANAGING VOLTAGE GENERATION

(75) Inventors: Antonino Conte, Tremestieri Etneo (IT);
Carmelo Ucciardello, Catania (IT);
Carmine D'Alessandro, Catania (IT);
Mario Micciche, Agrigento (IT);
Giovanni Matranga, Catania (IT);
Diego De Costantini, Augusta (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 0 days.

(21) Appl. No.: 11/780,206

(22) Filed: Jul. 19, 2007

(65) Prior Publication Data

US 2008/0018383 A1   Jan. 24, 2008

(30) Foreign Application Priority Data

Jul. 19, 2006   (EP) .................................. 06425495

(51) Int. Cl.
*G05F 1/10* (2006.01)
(52) U.S. Cl. ..................................... 327/536
(58) Field of Classification Search ................. 327/535, 327/536, 537
See application file for complete search history.

(56) References Cited

U.S. PATENT DOCUMENTS

| 6,429,732 | B1 * | 8/2002 | Tedrow et al. ............... 327/548 |
| 6,473,321 | B2 * | 10/2002 | Kishimoto et al. ............ 363/59 |
| 6,614,292 | B1 | 9/2003 | Chung et al. |
| 2002/0001207 | A1 | 1/2002 | Kishimoto et al. |

FOREIGN PATENT DOCUMENTS

WO   WO2004/023231   3/2004

OTHER PUBLICATIONS

European Search Report dated Jan. 8, 2007 for European Patent Application No. EP 06 42 5495.

* cited by examiner

*Primary Examiner*—Jeffrey S Zweizig
(74) *Attorney, Agent, or Firm*—Lisa K. Jorgenson; Stephen Bongini; Fleit Gibbons Gutman Bongini & Bianco P.L.

(57) ABSTRACT

A charge pump system is provided that includes at least one first pump for generating a first working voltage, a second pump for generating a second working voltage, and a third pump for generating a third working voltage. The first pump is connected to an internal supply voltage reference that can having a limited value, and has an output terminal connected to the second and third pumps so as to supplying them with the first working voltage as their supply voltage. A method is also provided for managing the generation of voltages to be used with such a charge pump system.

17 Claims, 7 Drawing Sheets

CHARGE PUMP SYSTEM AND CORRESPONDING METHOD FOR MANAGING VOLTAGE GENERATION

CROSS-REFERENCE TO RELATED APPLICATIONS

This application is based upon and claims priority from European Patent Application No. 06 425 495.6, filed Jul. 19, 2006, the entire disclosure of which is herein incorporated by reference.

FIELD OF THE INVENTION

The present invention relates to a charge pump system, and more specifically relates to a charge pump system of the type having at least one first pump for generating a first working voltage, a second pump for generating a second working voltage, and a third pump for generating a third working voltage. The present invention also relates to a method for managing voltage generation.

BACKGROUND OF THE INVENTION

Electrically erasable memory cells are nowadays widely used in many applications. Among these, Flash cells are of particular importance since they can be easily scaled with technologies that, for the future, will move to channel lengths of 90 nm and less.

In this context it becomes more and more important to succeed in integrating these types of Flash cells in standard CMOS technologies, so as to obtain memories of the embedded type which are nowadays widely used in many fields of the semiconductor market, such as SIM modules or memories for automotive applications.

When Flash memory cells are to be integrated in the recent 90 nm CMOS technologies there arise problems linked to the need, for low voltage transistors (or LV transistors), for operating with lower and lower supply voltages. The voltages supplied externally do not scale in the same way but tend to remain rather high, making it necessary to use Voltage Down Converters.

If these converters allow the separation of an external supply reference from an internal one, in correspondence with the current absorption peaks of, for example, an internal circuit of a memory device, they are subjected to inevitable losses or drops which can be on the order of some hundreds of mV. In this way, although using a converter suitable for regulating an internal supply voltage reference at a value for example equal to 1.2V (a typical working voltage for transistors realized in 90 nm technologies), it is inevitable that, due to this drop phenomenon, in reality minimum voltage values are obtained that can reach 1V.

All this implies significant difficulties in the design of memory devices, in particular of the Flash type, which normally need high operating voltages so as to modify and read the content of the memory cells.

Inside these memory devices of the Flash type a charge pump system is thus provided for the generation, starting from a single external supply voltage reference, of the internal voltage references that are necessary for the correct operation (e.g., reading, writing and erasing operations) of the Flash memory. This charge pump system is one of the analog blocks that is most difficult to implement and has to meet the following specifications:

1) minimum area occupation,
2) reduced current consumption,
3) functionality at very low supply voltage values, and
4) simultaneous generation of positive and negative voltage values with different regulation levels (in particular equal to +5V, +10V, and −10V).

Further problems arise in particular applications that provide wide external supply voltage ranges. This is the case, for example, in Smart Card applications, where the range of external supply voltage is extremely wide (from 1.65V up to 5.5V).

In these applications, the design of the charge pump system, normally supplied directly with these external supply voltages, turns out to be extremely complicated due to the wide range, which impels to:

a) use, in any case, many charge pump stages (normally also indicated as pumping phases) inside this charge pump system, in cascade to each other and with pump capacitors of great capacitance for meeting a lower limit of the external supply voltage range (normally equal to 1.65V);

b) insert some extremely large filter capacitors for reducing the ripple in correspondence with the high values of the external supply voltage range (normally equal to 5.5V); and c) entirely design the charge pump system with high voltage transistors (or HV transistors), with the buffer stages of the charge pump stages included, with a subsequent increase in the silicon area occupied by the system as a whole.

Normally, in Flash memories, it is necessary to generate at least three different regulated voltages so as to manage the operations of:

1) reading, in this case, the charge pump system must supply a first reading voltage Vr (normally equal to +5V);

2) programming, in this case, the charge pump system must simultaneously supply a first Vp1 and a second Vp2 programming voltage (normally equal to +5V, +10V, and −1V), the negative voltage value being in particular used for biasing, during a programming operation, the non-selected wordlines; and 3) erasing, in this case, the charge pump system must simultaneously supply a first Ve1 and a second Ve2 erasing voltage (normally equal to +10V, and −10V).

Since the required reading voltage is equal to the first programming voltage (Vr=Vp1), and the required second programming voltage is equal to the first erasing voltage (Vp2=Ve1), the charge pump system will practically have to supply three working voltages, usually indicated with VXR, VYP, and VNEG, and having values equal to +5V, +10V, and −10V, respectively.

Figure 1:
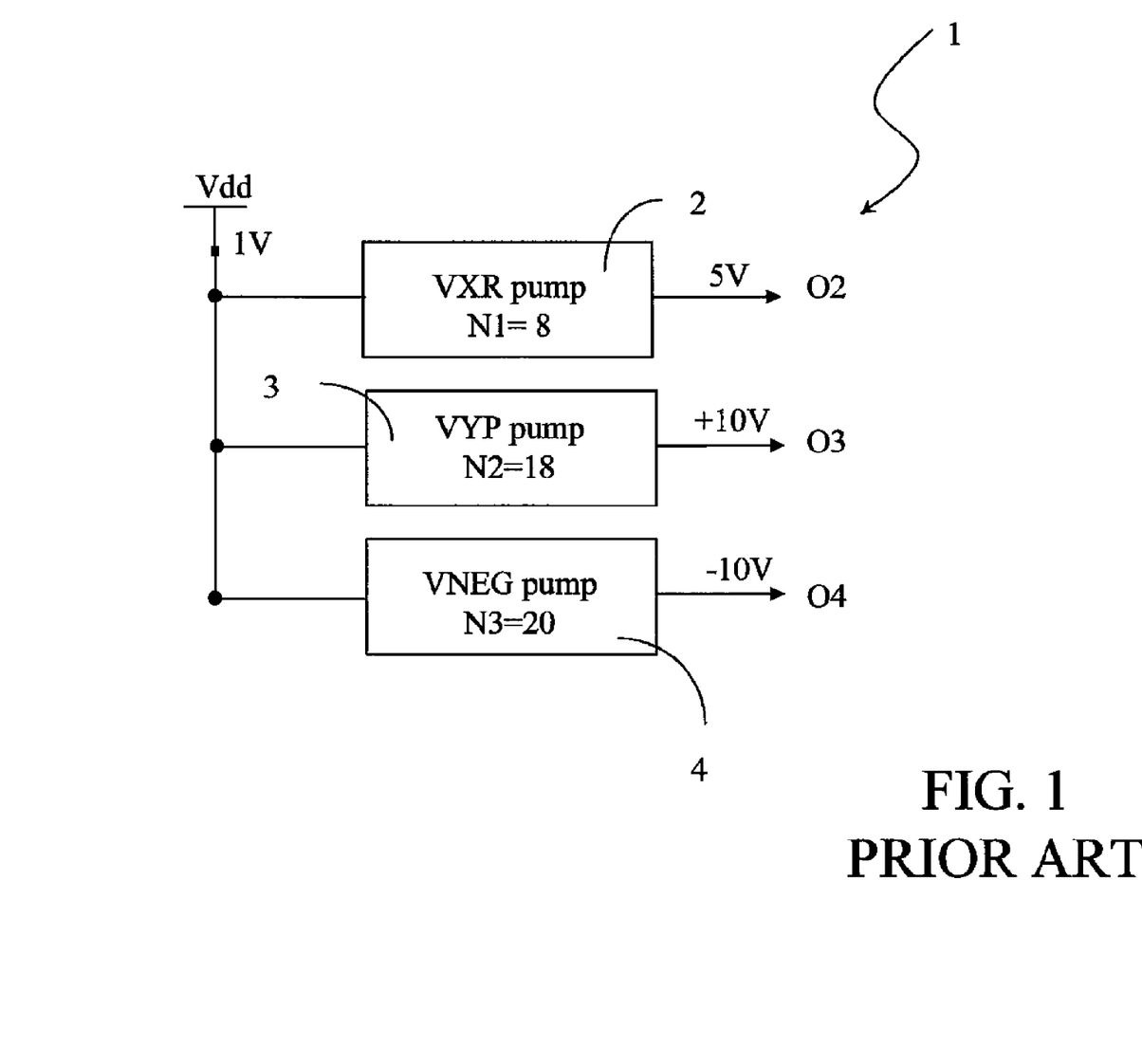
FIG. 1 shows a known charge pump system.

A known charge pump system is shown in FIG. 1. The charge pump system 1 comprises, in particular, a first 2, a second 3, and a third 4 pump, all supplied by the same internal supply voltage reference Vdd and suitable for supplying, on respective output terminals O2-O4 the above indicated working voltages. The pumps 2-4 are realized in a known way by a cascade of N charge pump stages.

It is possible to distinguish between the following cases:

a) the internal supply voltage Vdd is taken by a Voltage Down Converter and has a minimum voltage value equal to a minimum external supply voltage value (equal for example to 1.65V) further decreased by a fall or drop value (an inevitable drop being the Voltage Down Converter, a non-ideal element, normally equal to ~200 mV); in the indicated example, the internal supply voltage value Vdd is thus equal to ~1.45V; and b) the internal supply voltage Vdd coincides with one of the LV circuits in the Flash memory device and thus reaches a minimum value which can be also reduced below 1V.

In the first case, the three pumps 2, 3, and 4 of the system 1 should be completely realized with HV transistors, with a consequent large use of silicon area due to the rules used and to the lower efficiency of HV transistors with respect to LV transistors. Moreover, the frequency of use will not be very high (~60 MHz).

In the second case, the first 2 and the second 3 pumps (i.e., the pumps generating positive voltages) can be realized by LV transistors and HV capacitors so as to allow a savings in area with respect to the first case, and only the third pump 3 (i.e., the pump generating a negative voltage) has to be realized with HV transistors and capacitors. However, considering the ratio between the working voltage to be generated (+/−10V) and the internal supply voltage Vdd (+1V), they should comprise a high number N of pump stages (about N3=18 stages for the second pump 3 and up to N4=20 stages for the third pump 4, as indicated in the figure, in the case of an internal supply voltage Vdd equal to 1V).

SUMMARY OF THE INVENTION

An object of the present invention is to overcome the limits and drawbacks affecting the known circuits, and to provide a charge pump system for a memory device, for example of the Flash type, having such structural and functional characteristics as to allow a reduced area occupation and a reduction in the consumption of the system as a whole, also in the case of reduced internal supply voltage values.

Another object of the present invention is to provide a charge pump system having its pumps connected in cascade to each other, so that only the first pump is supplied by the internal supply voltage (which can be of limited value).

One embodiment of the present invention provides a charge pump system that includes at least one first pump for generating a first working voltage, a second pump for generating a second working voltage, and a third pump for generating a third working voltage. The first pump is connected to an internal supply voltage reference and has an output terminal connected to the second and third pumps so as to supply the first working voltage to the second and third pumps as their supply voltages.

Another embodiment of the present invention provides a method for managing voltage generation. According to the method, a first pump is used to generate a first working voltage, a second pump is used to generate a second working voltage, and a third pump is used to generate a third working voltage. The first pump is connected to an internal supply voltage reference, and the first working voltage is supplied to the second and third pumps as their supply voltages. the steps of using the second pump and using the third pump are controlled so as not to overlap the turn-on of the second and third pumps.

The characteristics and the advantages of systems and methods according to the present invention will be apparent from the following description of an embodiment thereof given by way of indicative and non-limiting example with reference to the annexed drawings.

DETAILED DESCRIPTION OF PREFERRED EMBODIMENTS

The present invention is particularly, but not exclusively, suited to a charge pump system for generating working voltages for a memory device, such as of the Flash type. The following description is made with reference to this field of application only for simplifying its illustration.

Figure 2:
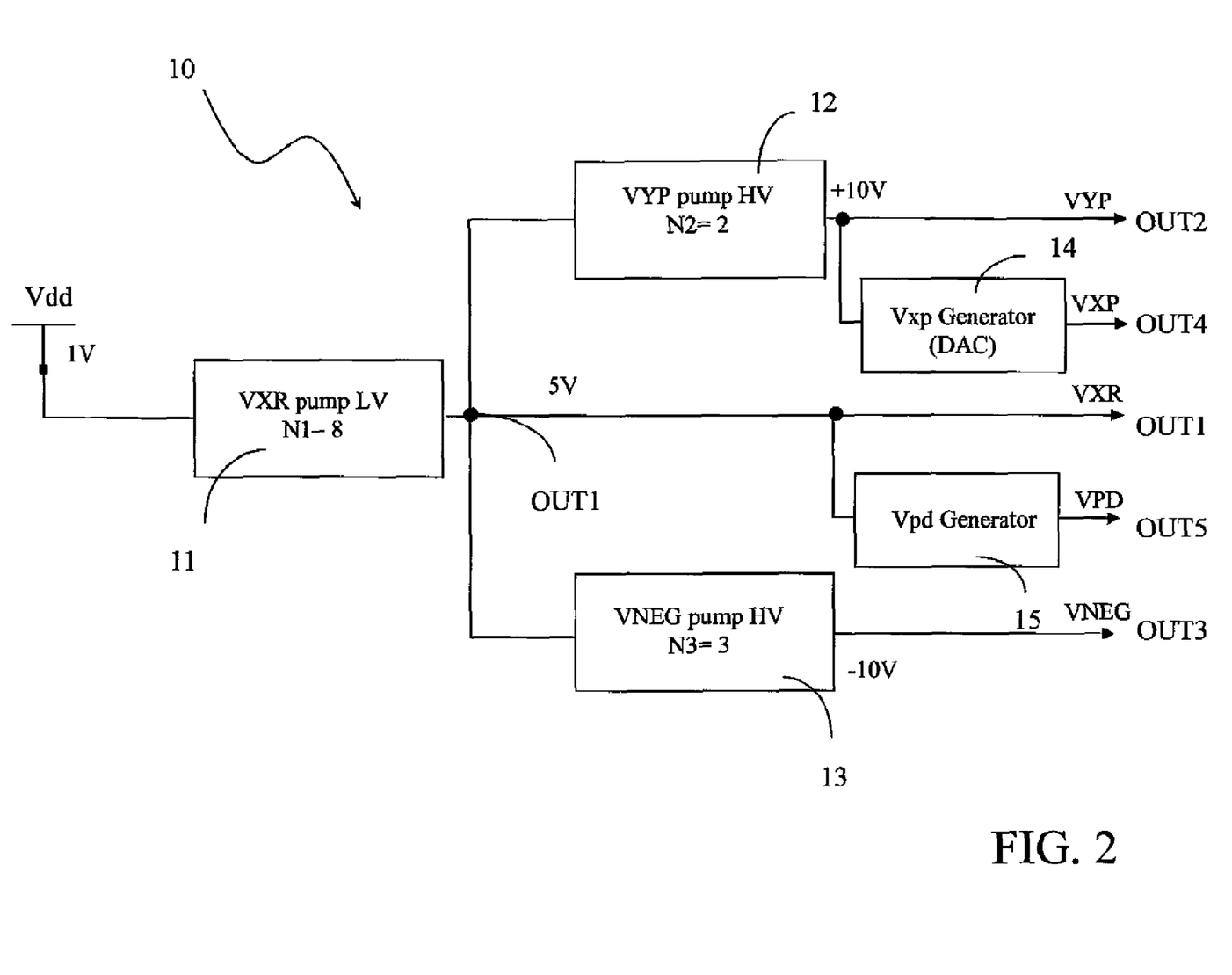
FIG. 2 shows a charge pump system according to one embodiment of the present invention.

FIG. 2 shows a charge pump system according to one embodiment of the present invention. The charge pump system 10 comprises a first pump 11 connected to and supplied by an internal supply voltage reference Vdd and having an output terminal OUT1.

A second pump 12 and a third pump 13 are connected to and supplied by the output terminal OUT1 of the first pump 11 and have respective output terminals OUT2 and OUT3.

In particular, the output terminal OUT1 of the first pump 11 supplies a first working voltage VXR having a suitable value for use in reading operations of a memory device, in particular of the Flash type, that is connected to the charge pump system 10 (hereafter, reading voltage VXR), the output terminal OUT2 of the second pump 12 supplies a second working voltage VYP having a suitable value for use in programming operations of such memory device (hereafter, programming voltage VYP), and the output terminal OUT3 of the third pump 13 supplies a third working voltage VNEG having a suitable value for use in erasing operations of the memory device (hereafter, erasing voltage VNEG).

In substance, the first pump 11 generates the supply voltage of the other two pumps 11 and 12, which are given the task of generating the high positive and negative voltages involved in the programming and erasing operations.

Suitably, the charge pump system 10 also comprises a first generator 14 of a ramp voltage VXP and a second generator 15 of a drain voltage VPD for the memory cells of the device connected to the system 10.

In particular, the first generator 14 is connected to and supplied by the output terminal OUT2 of the second pump 12 and comprises a DAC (Digital-to-Analog Converter) for generating the ramp voltage VXP to be supplied to the control (or gate) terminals of the memory cells. The first generator 14 has an output terminal OUT4 for supplying this ramp voltage VXP.

In a similar way, the second generator 15 is connected to and supplied by the output terminal OUT3 of the third pump 13 and comprises an operational amplifier for generating the drain voltage VPD to be supplied to the drain terminals of the memory cells. The second generator 15 has an output terminal OUT5 for supplying this drain voltage VPD.

Advantageously according to this embodiment of the present invention, only the first pump 11 is realized with LV transistors and with a high number N1 of pump stages (for example N1=8), while the second and third pumps 12 and 13 are realized with HV transistors and with an extremely reduced number of stages N2 and N3, in particular equal to N2=2 and N3=3 in this embodiment, as shown in FIG. 2.

In other words, the ratio between the first pump's number N1 of pump stages and the second and third pumps' numbers of pump stages N2 and N3 is greater than or equal to two in this embodiment.

Figure 3:
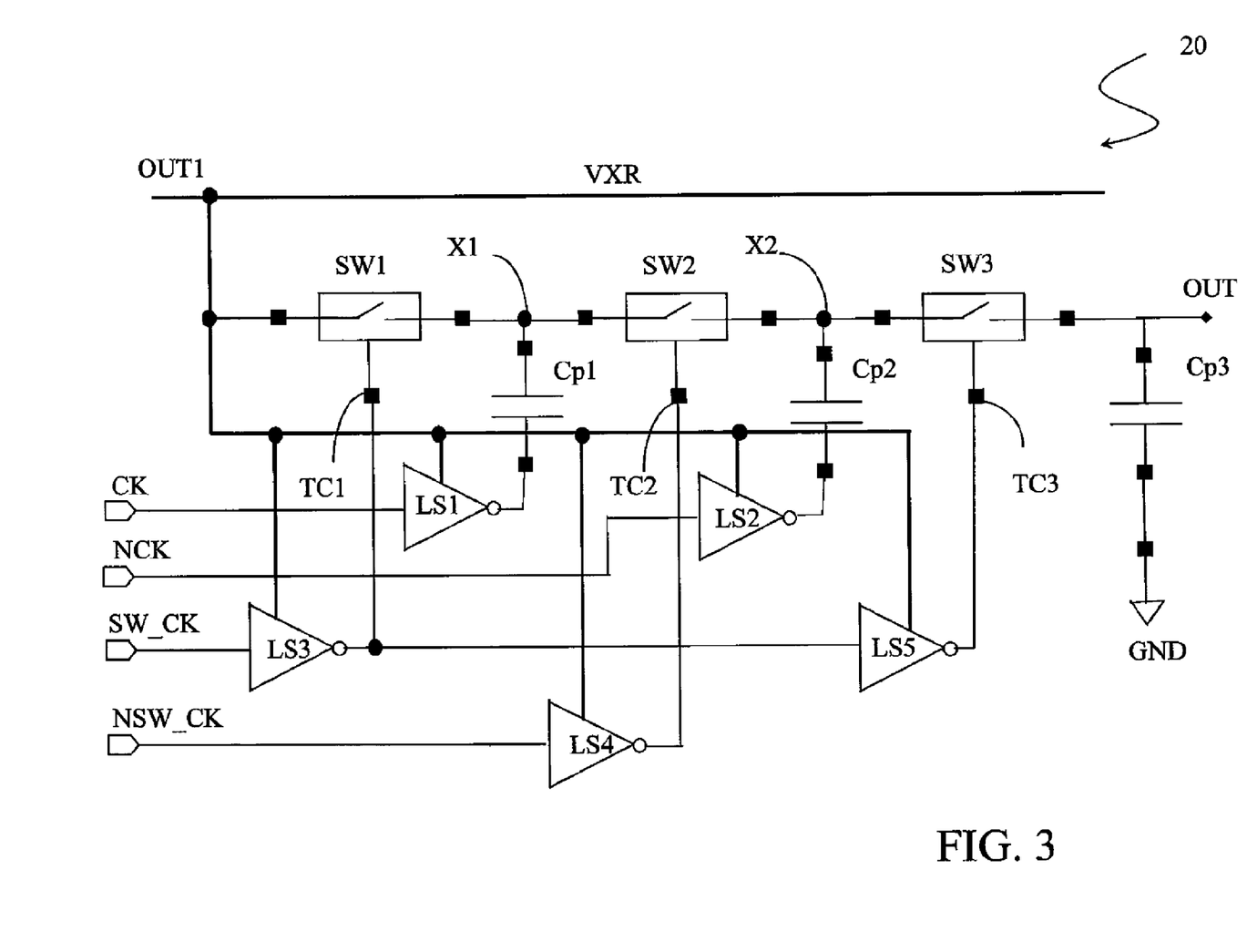
FIG. 3 shows in greater detail a portion of the system of FIG. 2 according to an exemplary embodiment.

FIG. 3 shows one exemplary embodiment of the present invention for connecting the pump stages in the second and third pumps 12 and 13 to the output terminal OUT1 of the first pump 11. FIG. 3 illustratively shows a three-phase pump stage 20.

This pump stage 20 comprises a first, a second, and a third pump capacitance Cp1-Cp3 connected to the terminal OUT1 (hereafter, supply reference OUT1) through respective switches SW1-SW3 and buffer stages LS1-LS5 connected to these pump capacities Cp1-Cp3 to the switches SW1-SW3 and to clock inputs CK, NCK, SW_CK, and NSW_CK. The buffer stages LS1-LS5 are all connected to and supplied by the supply reference OUT1.

In more detail, the first pump capacitance Cp1 is connected to a first inner circuit node X1, which is in turn connected to the supply reference OUT1 through the first switch SW1, as well as to a first clock input CK through a first buffer stage LS1.

The second pump capacitance Cp2 is connected to a second inner circuit node X2, which is in turn connected to the first inner circuit node X1 through the second switch SW2, as well as to a second clock input NCK.

Furthermore, the third pump capacitance Cp3 is connected between an output terminal OUT and a further voltage reference, in particular ground GND. This output terminal OUT is in turn connected to the second inner circuit node X2 through the third switch SW3.

The switches SW1-SW3 are driven in correspondence with respective driving terminals TC1-TC3 through respective third LS3, fourth LS4 and fifth LS5 buffer stages. In particular, the third buffer stage LS3 has an input connected to a third clock input SW_CK and an output that is supplied to the driving terminal TC1 of the first switch SW1, the fourth buffer stage LS4 has an input connected to a fourth clock input NSW_CK and an the output that is supplied to the driving terminal TC2 of the second switch SW2, and the fifth buffer stage LS5 has an input connected to the output of the third buffer stage LS3 and an output that is supplied to the driving terminal TC3 of the third switch SW3.

Suitably, these first and second clock inputs CK and NCK receive a first and a second clock signal, for simplicity indicated also as CK and NCK, which are complementary to each other. Similarly, the third and fourth clock inputs SW_CK and NSW_CK receive a third and a fourth clock signal, for simplicity also indicated as SW_CK and NSW_CK, which are complementary to each other.

Thanks to the supply being carried out with the voltage value that is output from the first pump 11, the buffer stages LS1-LS5 of the pump stage 20 are realized in this embodiment as simple level shifters, so the whole charge pump system 10 has an extremely reduced area.

However, the charge pump system 10 has some constraints to be respected for its correct operation.

1) The first pump 11 should be sized so as to sustain a current value equal to that simultaneously requested by the second 12 and the third 13 pumps (both HV pumps) placed downstream of this first pump 11.

2) The charge pump system 10 has a rather high mean and peak consumption and an over-sizing on the Down Converter side is thus to be provided, such side having to supply all the current requested by the whole system, in the case of use of the same for generating the working voltages necessary for the reading and modifying (programming/erasing) operations of a memory device connected to this charge pump system 10.

A method according to an embodiment of the present invention is thus proposed for managing the generation of voltages to be used for the charge pump system 10 so as to be able to minimize (or at least reduce) the above indicated consumptions.

Figure 4:
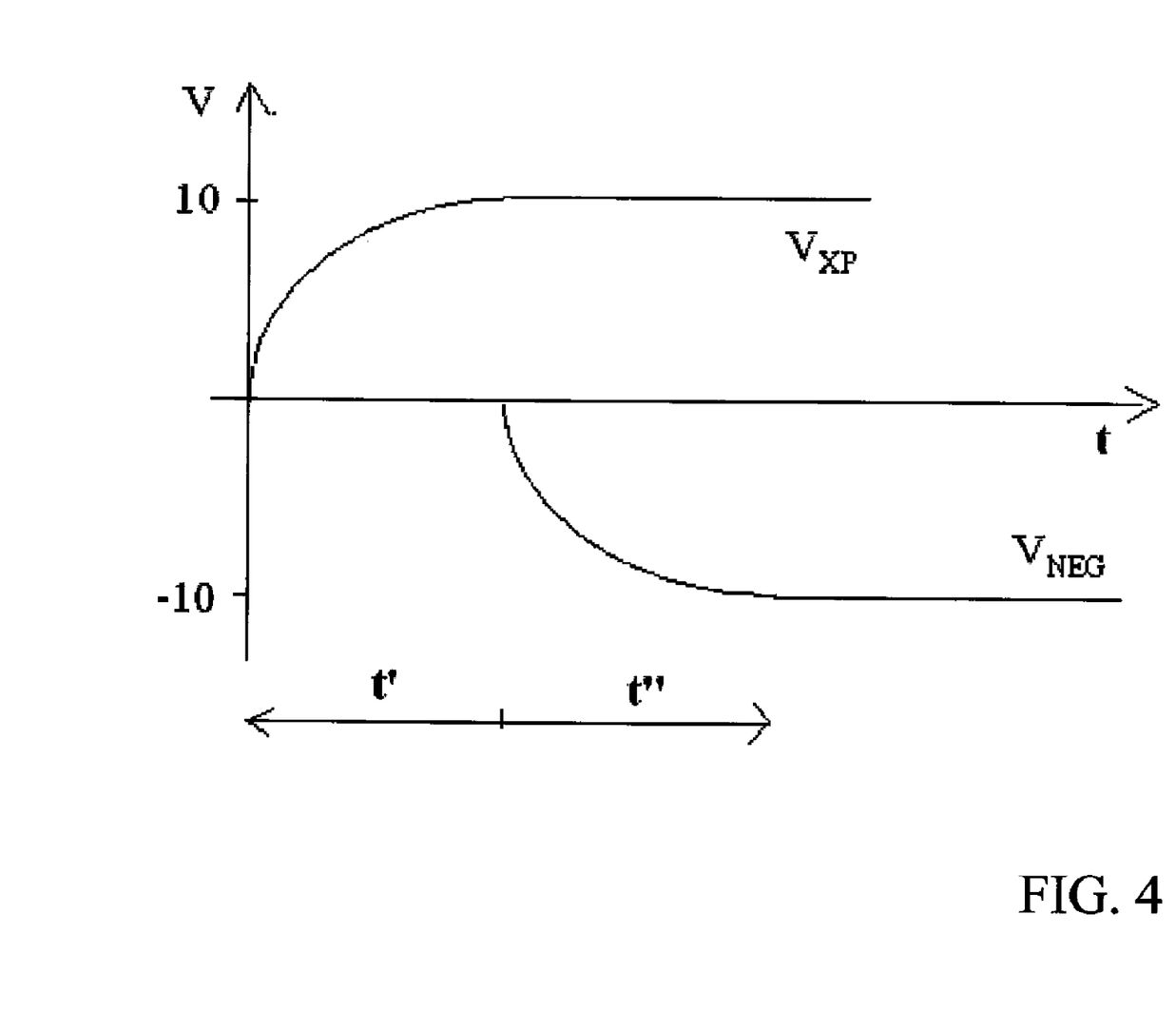
FIGS. 4-7 show signals relative to the charge pump system of FIG. 2.

In particular, this method for managing the generation of voltages controls the steps of generating the programming and erasing voltages so as not to simultaneously overlap the consumption of the corresponding pumps 12 and 13, which are downstream of the first pump 11, in the same time range, as indicated in FIG. 4.

Figure 5:
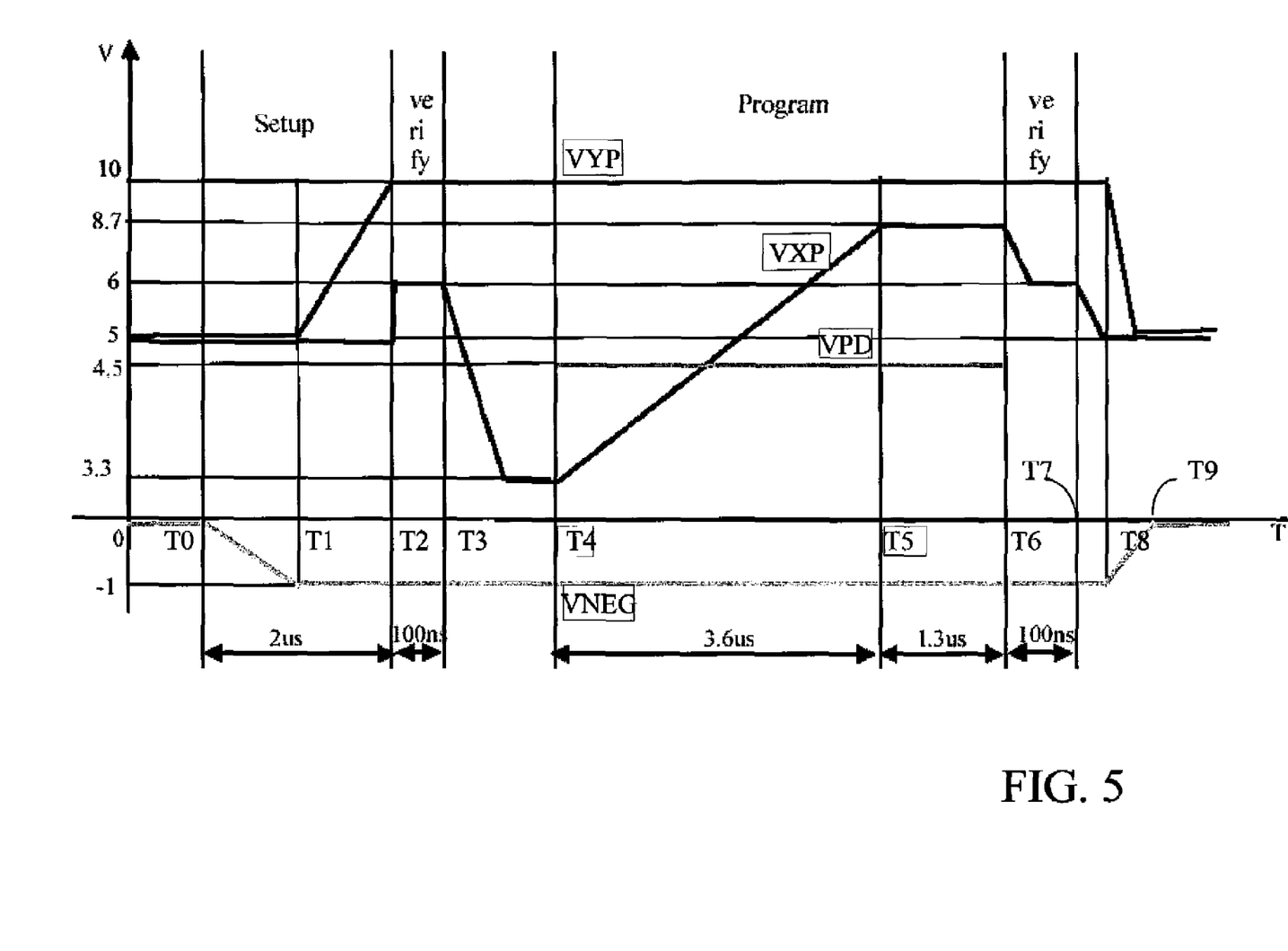

In more detail, making particular reference to FIG. 5, there are shown the various critical moments for the consumption of the charge pump system 10 used for generating the programming and erasing voltage of a memory device, for example of the Flash type. In this way, it is to be considered that the steps of greater consumption of these pumps are the setup steps, when the voltage values supplied by the pump change level.

To better understand this method, a programming operation [Program] is first considered.

In an initial step [Setup], the third pump 13 for supplying the negative voltage value, the erasing voltage VNEG (in particular equal to −1V) which is used for biasing the word lines which are not selected in programming and inhibiting possible program disturbances on the erased cells, is activated (instant T0).

In this step, the second pump 12 for supplying the programming voltage value VYP is not brought to the highest level (in particular equal to +10V), and remains latched (until the instant T1) to the supply voltage value at the output terminal OUT1 of the first pump 11 (i.e., the reading voltage VXR, in particular equal to +5V).

In other words, the method for managing the generation of voltages comprises a step of turn-on phase shift of the second and the third pumps 12 and 13, so that the second pump 12 is turned on only when the output terminal OUT3 of the third pump 13 has reached a requested voltage level. In particular, in the case of a programming step, the second pump 12 of the programming voltage VYP is turned on only at the instant T1 when the third pump 13 supplies on its output terminal OUT3 an erasing voltage VNEG having a value which is equal to −1V, as shown in the figure.

In this way, the method comprises a setup of the pumps divided into two different steps:

turn on of the third pump 13, from T0 to T1 with the erasing voltage VNEG at the output terminal OUT3 of this pump reaching the value of −1V; and turn on of the second pump 12, from T1 to T2 with the programming voltage VYP at the terminal OUT2 of this pump passing from a value equal to +5V (i.e., the value of the reading voltage VXR, which is the supply voltage for this pump), to a desired value for the programming (i.e., +10V).

More particularly, this step of turn-on phase shift thus comprises a latching step (latching period=T1−T0), in which the second pump 12 is maintained latched to the output terminal OUT1 of the first pump 11, which should thus supply current only to the third pump 13 for the generation of the erasing voltage VNEG.

Subsequently, the method provides an activation step of the second pump 12 for the generation of the high positive voltage value (i.e., the programming voltage VYP) which, as seen, will reach, with its own rise time Trise=T2−T1, from an initial value equal to its supply VXR (+5V), a final desired level (+10V) so as to allow the suitable biasing of the memory cell for the column decoding (i.e., +10V).

In this way, the method allows a reduction in the consumptions of the charge pump system 10 which depend in the first setup step only on the third pump 13 which reaches −1V (the second pump 12 being latched to VXR) and in the second setup step only on the second pump 12 which goes from +5V to +10V (the third pump 13 remaining at −1V).

The method then provides, in a known way:

a first verify step of the cells to be programmed (period from T2 to T3), wherein the programming voltage VYP and the erasing voltage VNEG remain at the values taken in the previous setup step, while the ramp voltage VXP reaches a reading value (equal to +6V), this programming verify step being in fact a real reading step;

a transition step (period from T3 to T4) in which the ramp voltage VXP again reaches a verify value (equal to +3.3V); and a real programming step (period from T4 to T5) in which the ramp voltage VXP reaches a programming value (equal to +8.7V) through the turn on of the first generator 14, in this step, also the second generator 15 generates the drain voltage VPD and supplies a current directly to the memory cells to be programmed.

The ramp voltage VXP raises with a controlled slope up to a value suitably lower than the value of the programming voltage VYP.

The method then comprises a "plateau step" (period from T5 to T6) in which the ramp voltage VXP maintains the value taken in the previous step (equal to +8.7V) followed by a verify step of the programmed cells (period from T6 to T7) and by a discharge or output step (period from T7 to T8), these steps not implying consumptions for the charge pump system 10.

Figure 6:
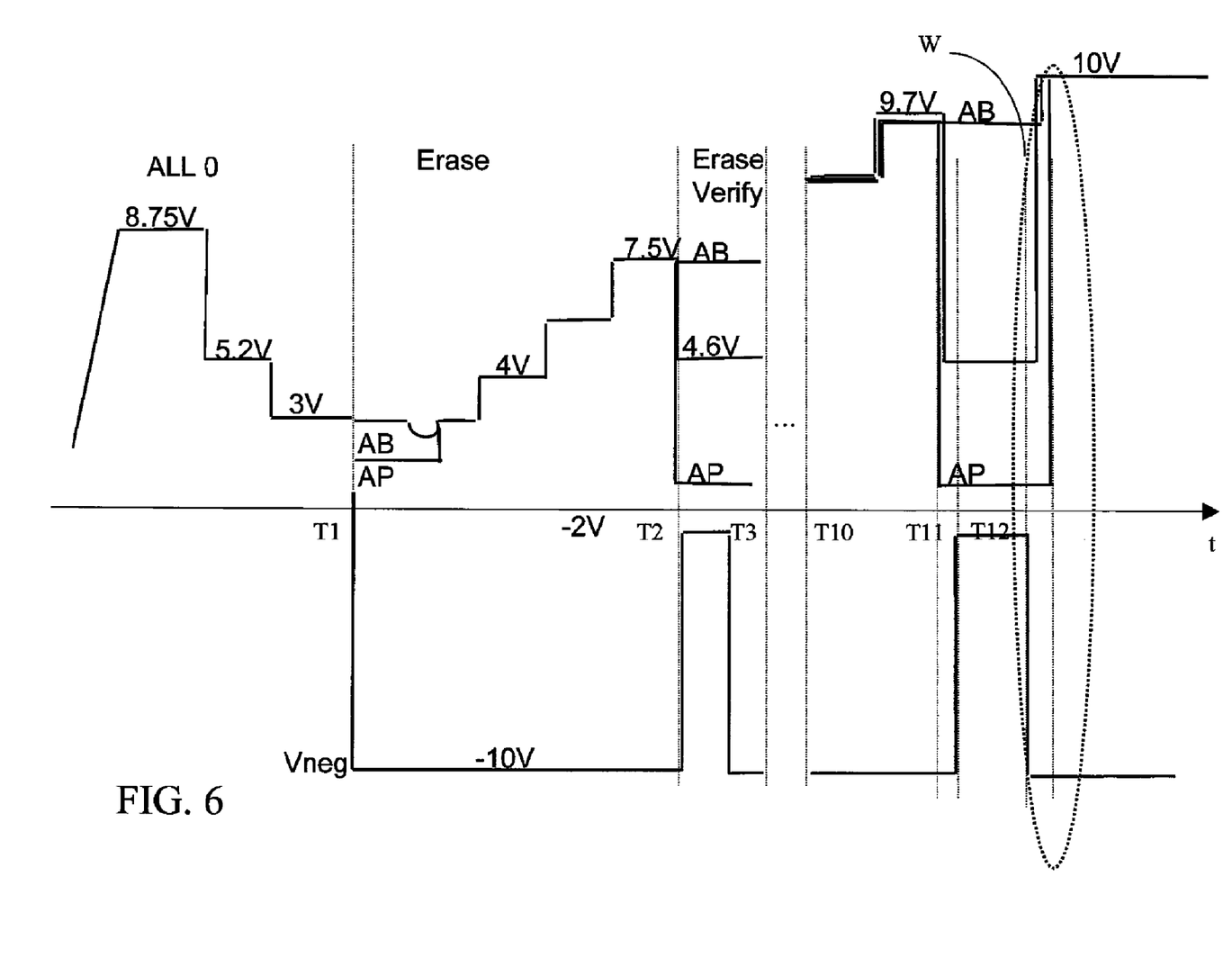
Figure 7:
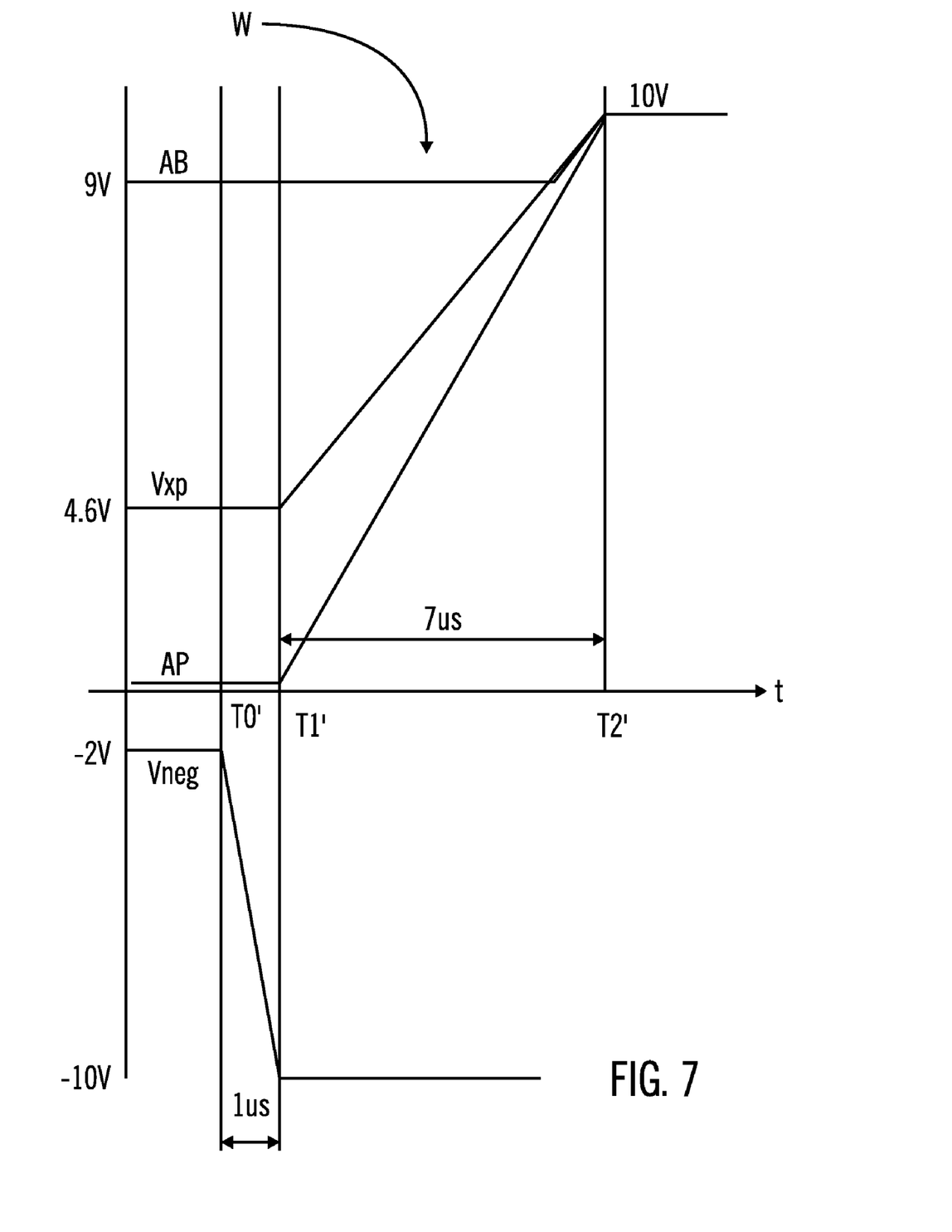

Making now reference to FIGS. 6 and 7, an erasing operation is considered.

In this case the method provides a management of the generation of the erasing voltage VNEG and of the ramp voltage VXP, with this latter one being however responsible for the consumptions of the charge pump system 10 since it is obtained through the first generator 14 supplied by the programming voltage VYP generated by the second pump 12. The programming voltage VYP is instead maintained fixed at a value equal to +10V.

In particular, as shown in FIG. 6, an erasing operation comprises a first step ALL0 (up to T1) in which all the cells are programmed at the value 0 with a step-like ramp voltage VXP followed by a real erasing step [Erase] which comprises a setup of the third pump 13 for the generation of the erasing voltage VNEG and of the first generator 14 for the generation of the ramp voltage VXP, with subsequent activation of the second pump 12 which supplies this first generator 14 with the voltage VYP as supply voltage.

In this erasing step a first voltage AB and a second voltage AP are generated to be respectively applied to the P wells which contain all the cells of a memory sector and to an N well which comprises these P wells also of different sectors. These first and second voltages AB and AP are brought to an initial value equal to about 3V up to a final erasing value equal to 7.5V.

In a known way, an erase verify step [Erase Verify] follows in which the first voltage AB is maintained at a value reached in the previous step, being equal to 7.5B, the second voltage AP is brought again to the value it had at the end of the previous step of ALL0 and the ramp voltage VXP is brought to a reading level being equal to 4.6V, this erasing verify step being in fact a real reading step.

The erasing and verify steps are repeated with a raising of the final value reached by the voltages AB, AP, and VXP.

Under the worst conditions (indicated in FIG. 6 with W and shown in greater detail in FIG. 7), this final value is equal to the maximum positive voltage value (i.e., +10V) and it will correspond to the maximum consumption of current by the charge pump system 10.

Also in this erasing operation, the method comprises a step of turn on phase shift of the second and the third pump 12 and 13 for which the first generator 14 of the ramp voltage VXP (which is supplied by the second pump 12) is turned on only when the output terminal OUT3 of the third pump 13 has been brought to a required voltage level. In particular, in the case of an erasing step, the first generator 14 of the ramp voltage VXP is turned on only in the instant T1' when the third pump 13 supplies its output terminal OUT3 with an erasing voltage VNEG having a value which is equal to −10V.

In this way, the method comprises a setup divided into two distinct steps:

turn on of the third pump 13, from T0' to T1' with the erasing voltage VNEG at the output terminal OUT3 of this pump which is brought to the value of −10V; and turn on of the first generator 14 (and subsequently of the second pump 12), from T1' to T2' with the ramp voltage VXP at the terminal OUT4 of this first generator 14 which passes from a value equal to +4.6V (i.e., the reading value of the previous erase verify step) to a desired value for the erasing (i.e., −10V).

In this way, the method allows a reduction in the consumptions of the charge pump system 10 which depend in the first setup step only on the third pump 13 which is brought to −10V (the second pump 12 not having to supply current to the first generator 14) and in the second setup step only on the first generator 14 which generates a ramp voltage VXP which passes from 4.6V to 10V and requires current from the second pump 12 which supplies it (the third pump 13 remaining at −10V).

Advantageously, this method for managing the generation of the voltage provides a control of the erasing pulses for minimizing the consumption of the pumps in the charge pump system 10.

In this way, the method for managing the generation of voltages applied to the charge pump system 10 prevents a simultaneous consumption by the pumps 12 and 13 which supply the programming voltage VYP and the erasing voltage VNE and regulate the generation of the ramp voltage VXP.

Advantageously, the consumption of current is thus limited for the first pump 11, and thus it allows the calibration of its sizing on the driving capability requested by the cells of the memory device connected to the charge pump system 10 which, in the case of a memory of the Flash type, should be programmed in parallel.

The method for managing the generation of voltages introduces an additional time required for avoiding the overlapping of the consumptions, but increases in a non-appreciable way the duration of the programming and erasing times.

Accordingly, the charge pump system according to the present invention allows reduced silicon area consumption and controlled pump current consumption, in particular of the first pump 11.

Its application is thus particularly advantageous in devices where the generation of the high voltages is necessary starting not from an external voltage reference but from an internal voltage reference regulated by a Down Converter, or where the supply voltages are extremely low (e.g., 1V or below).

Together with the method according to the present invention, it is possible to obtain the generation of the voltages required by the programming, erasing, and also reading operations, with a single pump supplied by the internal voltage reference and suitably connected to the other two pumps of extremely contained sizes (for the generation of the programming voltage VYP and of the erasing voltage VNEG). Advantageously, these further pumps can be realized with a minimum number of stages (2 and 3 respectively in the example shown), so as to greatly reduce the silicon area required for the realization of the whole charge pump system.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A charge pump system comprising:
    at least one first pump for generating a first working voltage;
    a second pump for generating a second working voltage; and
    a third pump for generating a third working voltage,
    wherein the first pump is connected to an internal supply voltage reference and has an output terminal connected to the second and third pumps so as to supply the first working voltage to the second and third pumps as their supply voltages, and
    the charge pump system further comprises at least one of:
        a first voltage generator coupled to an output terminal of the second pump, the first voltage generator comprising a Digital-to-Analog Converter; and
        a second voltage generator coupled to the output terminal of the first pump, the second voltage generator comprising an operational amplifier.

2. The charge pump system according to claim 1, wherein the first pump is realized with LV (low breakdown voltages transistors, and the second and third pumps are realized with HV (high breakdown voltage transistors.

3. The charge pump system according to claim 1, wherein the first pump has a first number of pump stages, the second pump has a second number of pump stages, the third pump has a third number of pump stages, the second and third numbers of pump stages are each smaller than the first number of pump stages, a ratio between the first number of pump stages and the second number of pump stages is greater than or equal to two, and a ratio between the first number of pump stages and the third number of pump stages is greater than or equal to two.

4. The charge pump system according to claim 3, wherein a ratio between the first number of pump stages and each of the second and third numbers of pump stages is greater than or equal to 8/3.

5. The charge pump system according to claim 1, wherein the charge pump system comprises the first voltage generator, the first voltage generator being connected to and supplied by an output terminal of the second pump and generating a fourth working voltage.

6. The charge pump system according to claim 5, wherein the first voltage generator comprises a Digital-to-Analog Converter.

7. The charge pump system according to claim 5, wherein the charge pump system also comprises the second voltage generator, the second voltage generator generating a fifth working voltage.

8. The charge pump system according to claim 7, wherein the second voltage generator comprises an operational amplifier.

9. A memory device comprising at least one charge pump system for generating working voltages for the memory device, the charge pump system comprising:
    at least one first pump for generating a first working voltage;
    a second pump for generating a second working voltage; and
    a third pump for generating a third working voltage,
    wherein the first pump is connected to an internal supply voltage reference and has an output terminal connected to the second and third pumps so as to supply the first working voltage to the second and third pumps as their supply voltages, and
    the charge pump system further comprises at least one of:
        a first voltage generator coupled to an output terminal of the second pump, the first voltage generator comprising a Digital-to-Analog Converter; and
        a second voltage generator coupled to an output terminal of the first pump, the second voltage generator comprising an operational amplifier.

10. The memory device according to claim 9,
    wherein the first working voltage is used for reading operations of the memory device,
    the second working voltage is used for programming operations of the memory device, and
    the third working voltage is used for erasing operations of the memory device.

11. The memory device according to claim 10, wherein the first working voltage has a positive voltage value, the second working voltage has a higher positive voltage value, and the third working voltage has a negative voltage value.

12. The memory device according to claim 10, wherein the first working voltage has a value substantially equal to +5V, the second working voltage has a value substantially equal to +10V, and the third working voltage has a value substantially equal to −10V.

13. The memory device according to claim 9, wherein the second and third pumps each comprise:
    a plurality of switches connected in series between the output terminal of the first pump and this pump's output terminal;
    a plurality of pump capacitances coupled to this pump's output terminal by the switches; and
    a plurality of buffer stages coupled to the pump capacitances and the switches, the buffer stages comprising level shifters,
    wherein at least one of the pump capacitances has one terminal coupled to a circuit node connecting two of the switches, and has another terminal that receives a clock signal through one of the buffer stages.

14. A method for managing voltage generation, the method comprising the steps of:
    using a first pump to generate a first working voltage, the first pump being connected to an internal supply voltage reference
    using a second pump to generate a second working voltage;
    using a third pump to generate a third working voltage;
    supplying the first working voltage to the second and third pumps as their supply voltages; and during an operation that requires both the second and third working voltages to change voltage level, managing generation of the second and third working voltages so as not to overlap the turn-on of the second and third pumps by:

first activating only one of the second and third pumps in order to cause a corresponding one of the second and third working voltages to reach its required voltage level, and after the corresponding one of the second and third working voltages reaches its required voltage level, activating the other of the second and third pumps in order to cause the other of the second and third working voltages to reach its required voltage level.

15. The method according to claim 14, wherein the managing step comprises first activating the third pump and then activating the second pump only when the output terminal of the third pump has reached its required voltage level.

16. The method according to claim 14, wherein the operation that requires both the second and third working voltages to change voltage level is a programming operation of a memory device, and in the managing step, the second pump is latched to the first working voltage while the third pump is activated until the third working voltage reaches its required value for the programming operation, and after the third working voltage reaches its required value for the programming operation the second pump is then activated to cause the second working voltage to reach its required value for the programming operation.

17. A method for managing voltage generation, the method comprising the steps of:

using a first pump to generate a first working voltage, the first pump being connected to an internal supply voltage reference;

using a second pump to generate a second working voltage;

using a third pump to generate a third working voltage;

supplying the first working voltage to the second and third pumps as their supply voltages; and controlling the steps of using the second pump and using the third pump so as not to overlap the turn-on of the second and third pumps, wherein the method further comprises performing an erasing operation of a memory device in which a first generator for generating a ramp voltage is maintained at a reading value until the third working voltage reaches a desired value for the erasing operation, and is then turned on until the ramp voltage reaches a desired value for the erasing operation and the second pump is turned on for supplying the first generator.

* * * * *